United States Patent [19]

Eatwell

[11] Patent Number: 5,652,770
[45] Date of Patent: Jul. 29, 1997

[54] SAMPLED-DATA FILTER WITH LOW DELAY

[75] Inventor: Graham P. Eatwell, Caldecote, United Kingdom

[73] Assignee: Noise Cancellation Technologies, Inc., Linthicum, Md.

[21] Appl. No.: 403,908

[22] PCT Filed: Sep. 21, 1992

[86] PCT No.: PCT/US92/07802

§ 371 Date: Mar. 21, 1995

§ 102(e) Date: Mar. 21, 1995

[87] PCT Pub. No.: WO94/07212

PCT Pub. Date: Mar. 31, 1994

[51] Int. Cl.⁶ ........................................ G06J 1/00
[52] U.S. Cl. ........................... 375/350; 364/724.011
[58] Field of Search ............................. 375/227, 346, 375/350; 364/724.01, 724.15, 825

[56] References Cited

U.S. PATENT DOCUMENTS

| | | |
|---|---|---|
| 4,519,084 | 5/1985 | Langseth . |
| 4,825,396 | 4/1989 | Gazsi . |
| 4,872,127 | 10/1989 | Nolan . |
| 4,922,530 | 5/1990 | Kenney et al. . |
| 5,038,269 | 8/1991 | Grimble et al. . |
| 5,057,993 | 10/1991 | Kanda . |
| 5,519,735 | 5/1996 | Rice et al. ................. 375/350 |
| 5,521,946 | 5/1996 | Main ......................... 375/350 |

*Primary Examiner*—Melvin Marcelo

[57] ABSTRACT

A filter system with low throughput delay having at least two parallel filters, either sampled-data or continuous, wherein one of the filters has a low throughput delay in comparison with the other filters.

19 Claims, 9 Drawing Sheets

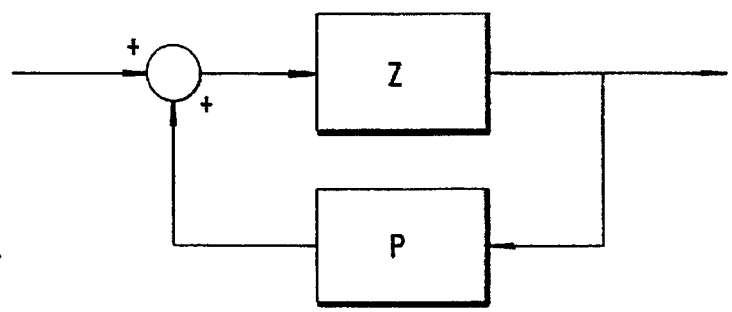
FIG.4
FIG.5
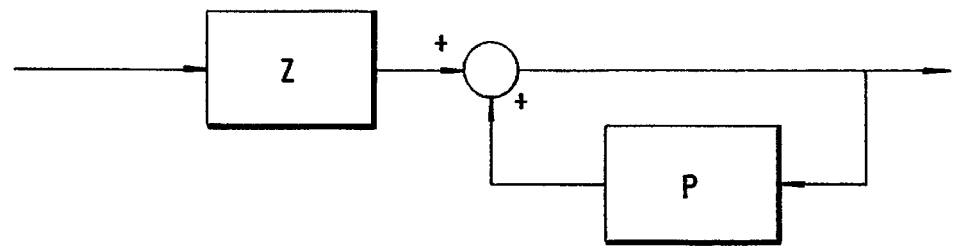
FIG.6
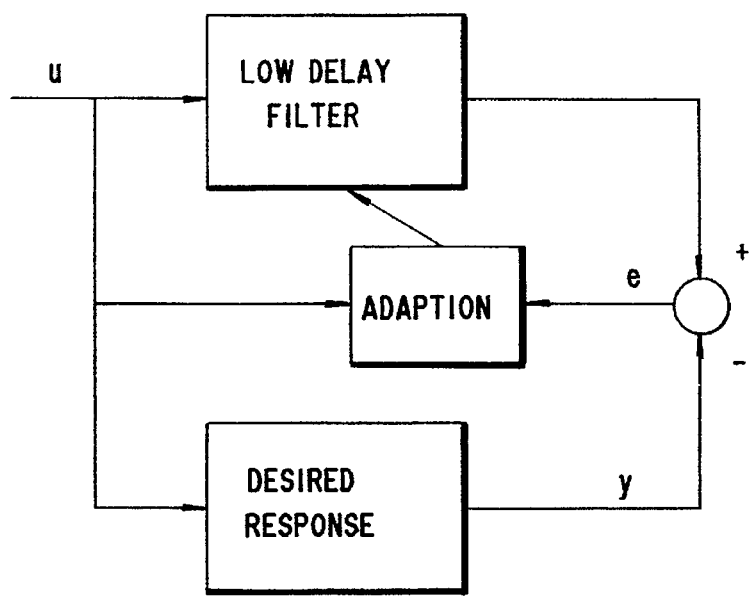

SAMPLED-DATA FILTER WITH LOW DELAY

BACKGROUND

There are many applications where filtering is required with a minimum of delay through the filter. One such application is in real-time control systems used for active noise cancellation.

Modern control systems often use sampled-data filters which may be analog devices such as charge coupled devices but are more often digital filters. There are inherent delays associated with a sampled-data filter. For example, in a digital filter these are due to the anti-aliasing filters (which may be digital or analog), the anti-imaging filters (which may be digital or analog), the sample and hold of the Digital to Analog Converter (DAC) and the computation time of the digital processor.

The first three of these are related to the sampling period of the digital filter. They can be reduced by increasing the sampling rate of the digital filter. However, this requires an increase in the computational power of the processor and results in increased cost and electrical power consumption.

For some applications a fixed filter is sufficient, and there have been attempts in the past to modify digital filters by combining them with analog components.

It is known that the delay associated with the filter can be avoided if the digital filter is combined with an analog circuit in such a way that there are a least two paths through the filter, one of which avoids the digital filter.

For example, in UK patent GB2142091, 'Attenuation of sound waves', Swinbanks describes a filter, shown in FIG. 1, which comprises a fixed analog gain with digital FIR filter in the feedback path and in UK patent application GB2222733, 'Improved digital filter with an analog path', Harper and Ross describe a fixed analog filter with a digital FIR filter in a parallel path. This is shown in FIG. 2.

For most practical applications however, it is necessary to adjust the overall response of the filter in order to maintain the best control performance in a changing environment. There are no previously known methods for adapting combined filters of the type described by Swinbanks or by Harper and Ross.

There is some discussion by Swinbanks of how to determine the digital filter coefficients when a fixed-gain analog amplifier is used, but this is only possible if the characteristics of the system to be controlled are fixed and can be determined in advance. There is no discussion of how to choose the gain of the analog amplifier.

While there is some discussion by Harper and Ross of how to determine the desired characteristic of the analog filter when the digital filter is fixed, there is no discussion of how to determine the characteristics jointly.

The desired response can be more closely matched by designing the two filters together. Additionally, it is often desirable to use a fully adaptive control system for practical control applications. This avoids the need to redesign the system for each new application and allows the control system to be used when the system to be controlled varies with time.

The digital filters described by Swinbanks and by Harper et al are for use with feedforward active control systems. For this type of control system an 'upstream' sensor is used to obtain an advance measurement of the noise to be canceled. In this application, the characteristic of the digital filter depends upon the acoustic response of the physical system and on the characteristics of the actuator. These may be slowly varying over time. However, feedback control systems do not use an 'upstream' sensor, instead they only use sensors in the region where noise control is required. In this case the information received from the sensor is generally too late, and the control system must be able to predict the noise. Any delay through the filter will make this prediction more difficult. The prediction is strongly dependent upon the characteristics of the noise, and so the filter characteristics must be varied as the noise varies. Hence, active feedback control requires a fully adaptive control system with a low throughput delay.

Accordingly, it is an object of this invention to provide a filter with a low throughput delay without using a processor.

Another object of this invention is to provide a filter means having multiple paths therethrough, one of them being a higher speed path than at least one of the others.

A further object of this invention is to provide a parallel path filtering means wherein the characteristics of the filters are selected to minimize the difference between overall filter response and the desired response.

A still further object of this invention is to provide a method of avoiding filter delays in an active noise cancellation circuit.

These and other objects will become readily apparent when reference is had to the accompanying drawings in which FIG. 1 shows a circuit from background art, FIG. 2 is a diagrammatic view of a background art circuit, FIG. 3 is a diagrammatic view of a low delay filter, FIG. 4 is a diagrammatic view of a recursive filter, FIG. 5 is a diagrammatic view of another type of recursive filter, FIG. 6 is a diagrammatic view of an adaptive filter, FIG. 7 is a diagrammatic view of an active control system, FIG. 8 is a diagrammatic view of a control system with a two-path filter, FIG. 9 is a diagrammatic view of a multi-channel control system, FIG. 10 is a diagrammatic view of an adaptive feedforward control system, FIG. 11 is a diagrammatic view of an adaptive feedback control system, and FIG. 12 is a diagrammatic view of a general purpose sigma delta chip.

SUMMARY OF THE INVENTION

An object of this invention is to provide a filter with a low throughput delay without the need and expense of using a very powerful and expensive processor which is achieved by using a filter with multiple signal paths through it.

In one embodiment of the invention the filter has at least two paths through it, at least one of which is a high speed path and at least one of which is a slower speed path such as that through a sampled data filter. This is shown in FIG. 3. Each high speed path can be an analog gain or analog filter or it can be a sampled-data filter with one or more coefficients. The sample rate of the sampled-data filter is set to be high so that the delay through the filter is small. One example configuration uses a high speed sampled-data filter with one or more coefficients in parallel with a slower speed sampled-data filter.

The sampled-data filters can take many forms, including Moving Average, Auto Regressive, Lattice and Artificial Neural Networks and may be implemented in digital or analog form. The low delay filters can themselves be combined, as in FIGS. 4 and 5 for example, to form more complicated filter structures. Many other structures will be obvious to those skilled in the art of filter design.

A further object of this invention is to provide an adaptive filter with a low throughput delay. In one embodiment of the invention this is achieved by minimizing a filtered version of the one or more error signals. This approach allows the filter coefficients to be updated using only data sampled at slow rate and so reduces the processing requirements.

Common applications of adaptive filters are shown in FIGS. 6 and 7. FIG. 6 shows the adaption process being used to generate a filter with a desired response. This is obtained by comparing the filter output with a desired signal, y, to generate an error signal, e, which drives the adaption process. The desired signal can be generated as in the figure by passing the input signal through a system with the desired response (this may be a physical system for example).

Another application for adaptive filters is in adaptive control as shown in FIG. 7. Here the objective is to obtain a desired response (often zero) at a set of residual sensors. These residual sensors are responsive to the combination of an original disturbance, such as sound or vibration or an electrical signal, and a control disturbance generated by a set of control actuators. The control signal for these actuators can be obtained by filtering a signal derived from the error signals and/or by filtering the signals from an additional set of reference sensors. The filters in the figure can have multiple interacting inputs and outputs.

DETAILED DESCRIPTION OF THE INVENTION

Figure 1:
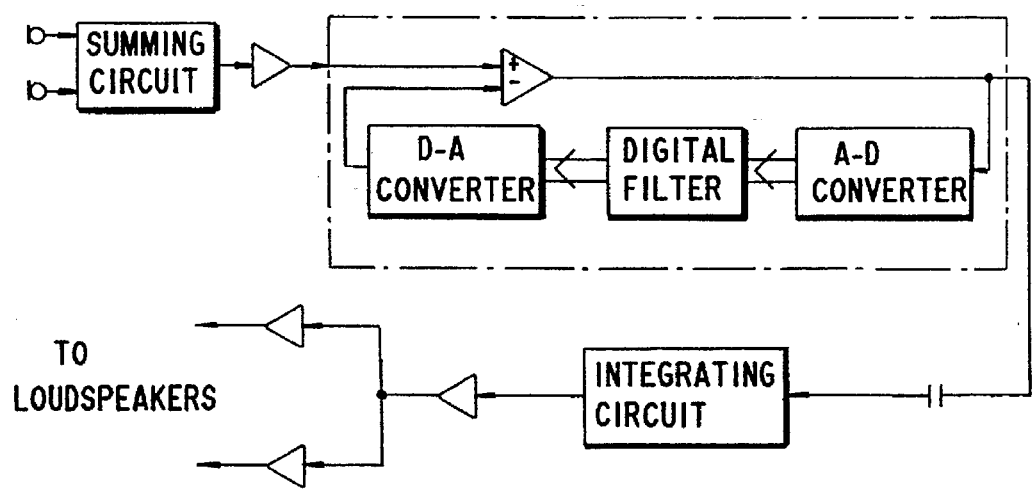
Figure 2:
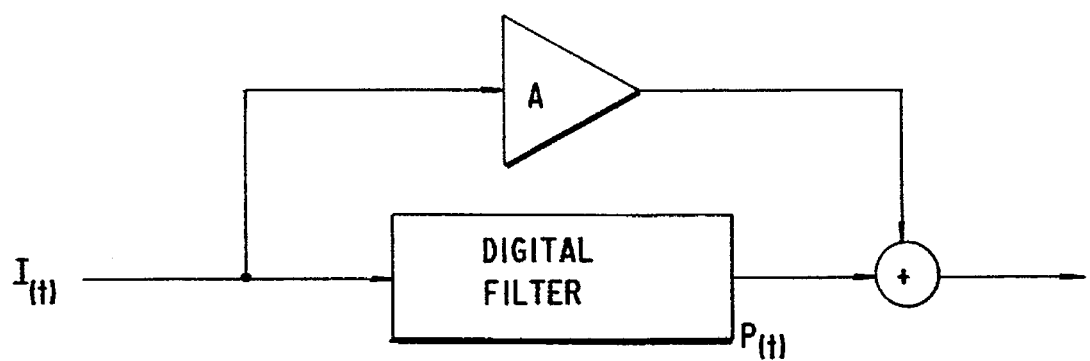
Figure 3:
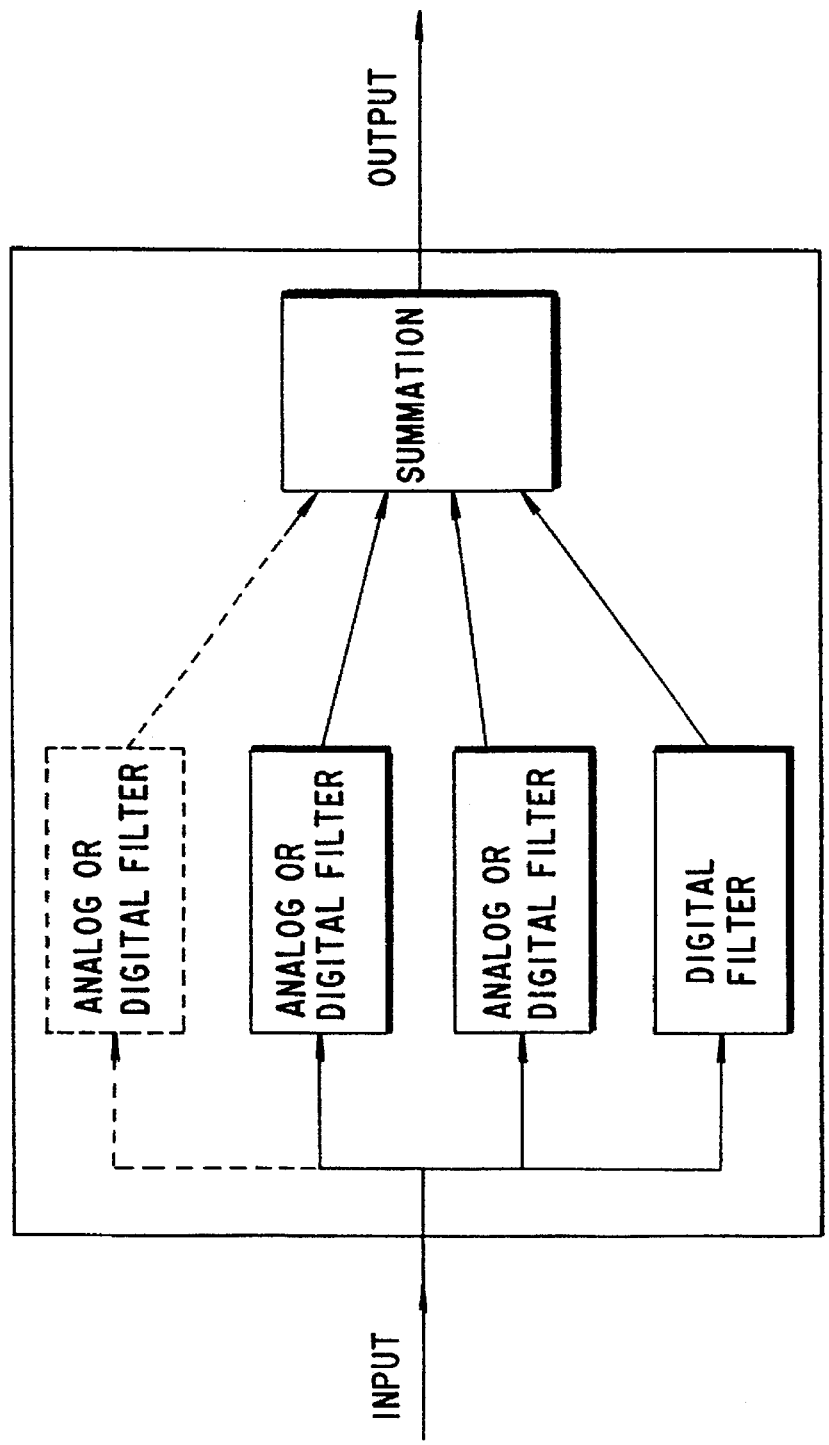
Figure 7:
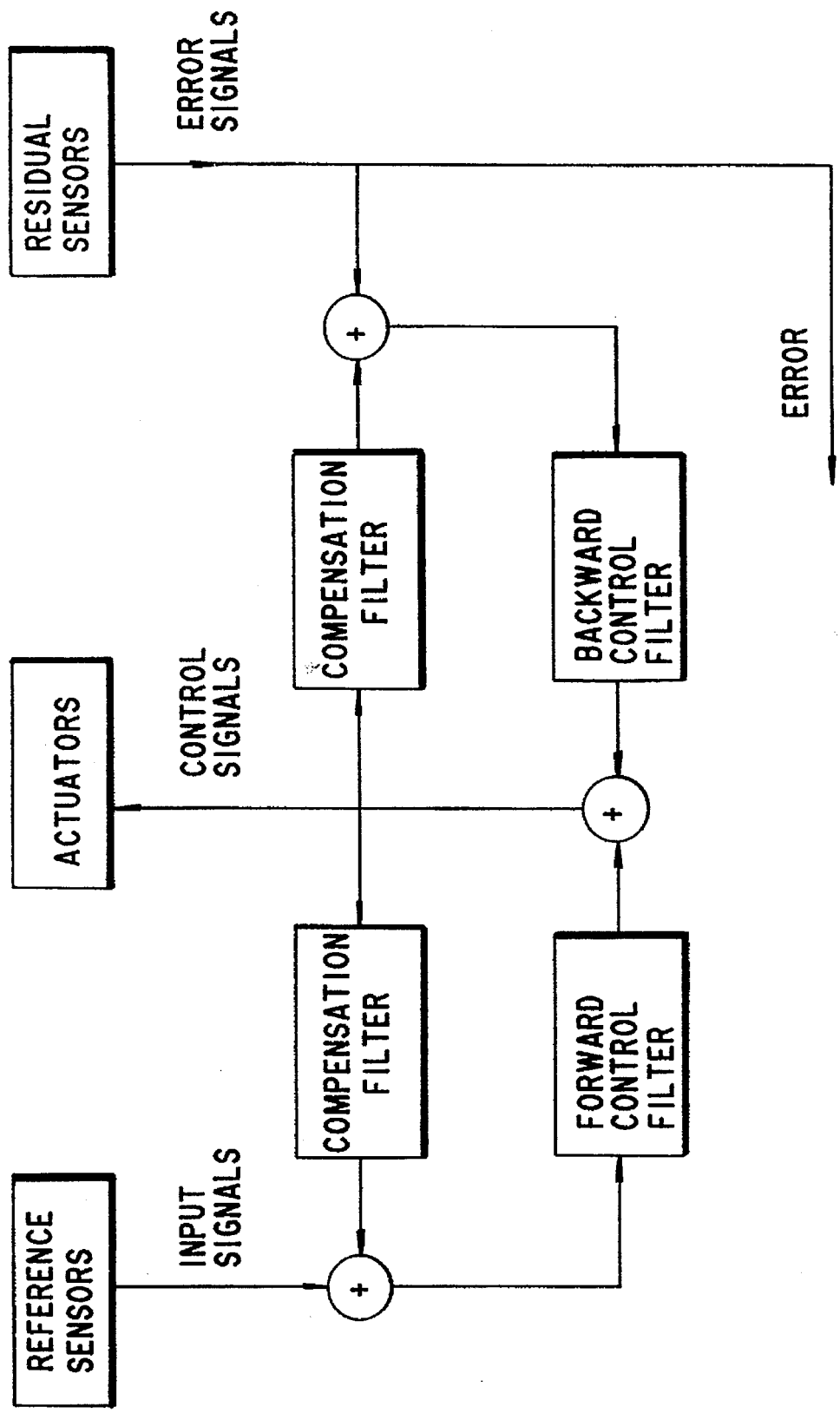
Figure 8:
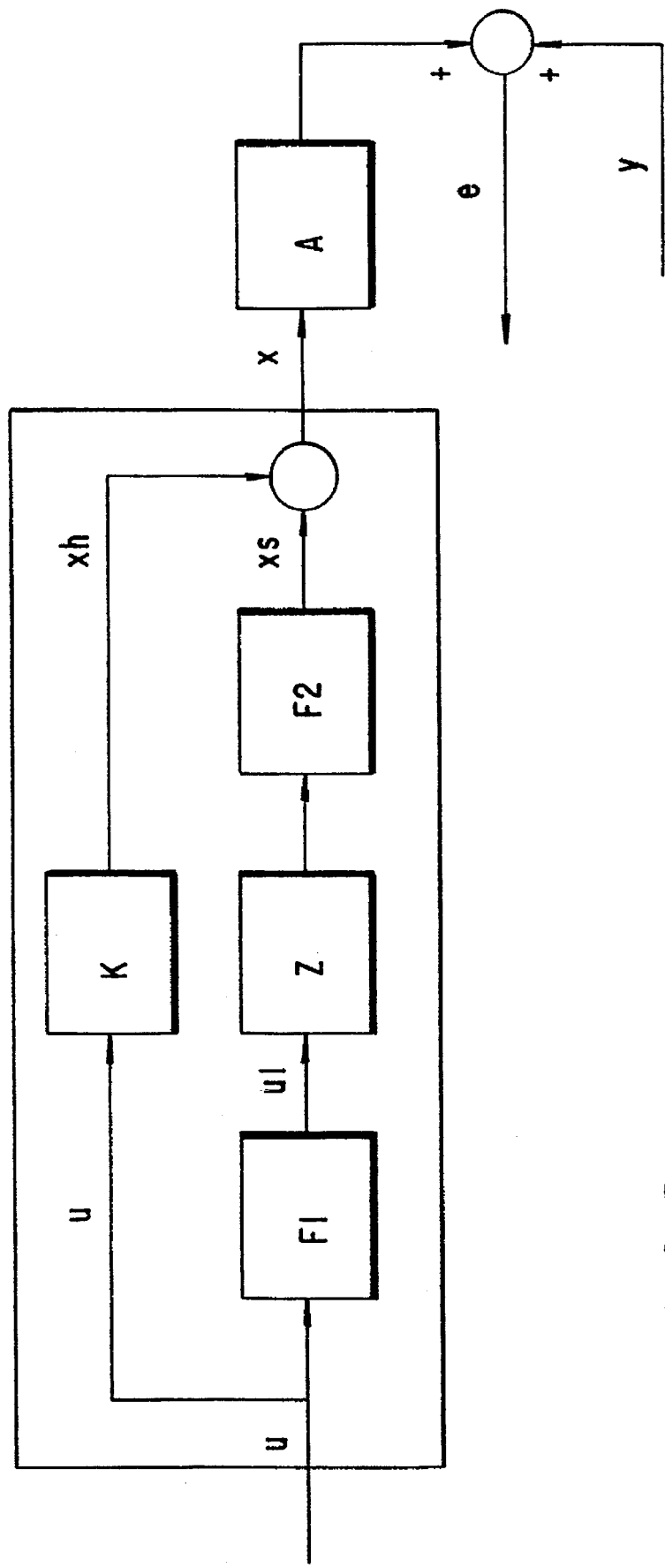

By way of explanation we shall describe a filter comprising a slow speed Finite Impulse Response (FIR) sampled-data filter in parallel with a high speed sampled-data filter with sampling period T. This filter is shown in FIG. 8. Also included in FIG. 8 is physical system labeled A. For some adaptive filters this may have a unity response. The desired signal, -y, may be the signal due to an unwanted disturbance or may be generated from the filter input as in FIG. 6.

In FIG. 8, K is the gain of the high speed filter (sampled-data or continuous), $F_1$ is the anti-aliasing filter, $F_2$ is the anti-imaging filter and Z is the slower speed sampled-data filter.

At time kT, the output from the anti-aliasing filter, sampled at the higher sampling rate, is $$u_1(kT) = \sum_l F_1(lT) \cdot u(kT - lT)$$

where $F_1(t)$ is the impulse response of the anti-aliasing filter and u(t) is the common high speed input signal.

The sampling period of the slow speed filter is NT, which means that the filter uses only every N-th value of the high speed input.

We define the operator |.| by $$|k| = N . \text{integer part of}(k/N)$$

The output from the anti-imaging filter at time t during the k-th sampling period is $x_s(t)$, given by $$x_s(kT) = \sum_n z_n \cdot u_{12}(|k - Nn|).$$

-continued where $$u_{12}(|k - Nn|) = \sum_m F_2(mT) \cdot u_1(|k - m - Nn|T)$$

and where $z_n$ is the n-th filter coefficient and $F_2(t)$ is the impulse response of the anti-imaging filter. The n-summation is over all filter coefficients.

In one embodiment of the invention the high speed path is placed in parallel with FIR filter as shown in FIG. 8.

If the high speed path is an analog amplifier the output is $$x_h(t) = K . u(t),$$

where K is the amplifier gain.

Alternatively, the high speed path can be a sampled-data filter with a single coefficient running N times faster than the slow speed filter. The output from this filter is $$x_h(kT) = K . u(kT),$$

where K is the coefficient value. A sampled-data filter with more coefficients could be used.

The high and slow speed outputs are summed to give the controller output signal, x(t). If the high speed filter is a sampled-data filter the outputs can be combined as sampled-data signals or as analog signals. Also if the high speed filter is a sampled-data filter its output must usually be passed through an anti-imaging filter.

In a control system the output signal is used to drive an actuator which produces a controlling disturbance.

In an adaptive control system, a residual sensor is often used to measure the combination of the original disturbance and the controlling disturbance. This signal is then used to adjust or adapt the coefficients of the filters in order to obtain some desired effect (usually a reduction in the level of the disturbance).

The sampled response at a residual sensor at time rT is $$e(rT) = y(rT) + \sum_m A(rT - mT) \cdot (x_s + x_h)(mT),$$

where y is the part of the response not due to the controller, and A(t) is the response corresponding to a unit impulse at the controller output. If a sampled-data high speed path is used then A(t) includes the anti-imaging filter for the high speed filter and the anti-imaging filter on the residual sensor.

This residual signal can be written in terms of the filter coefficients and the input signals $$e(rT) = y(rT) + v(rT)K + \sum_n w(r,n) \cdot z_n,$$

where $$v(rT) = \sum_l A(rT - lT) \cdot u(lT)$$

and $$w(r,n) = \sum_l A(rT - lT) \cdot u_{12}(|l - NnlT|).$$

We can express the vector of successive samples in matrix notation as $$\underline{e} = \underline{y} + \underline{v}K + W\underline{z},$$

where $$\underline{e} = \{e_n, e_{n-1}, e_{n-2}, \ldots, e_{n-m}\}^T,$$

$$\underline{y} = \{y_n, y_{n-1}, y_{n-2}, \ldots, y_{n-m}\}^T,$$

$$\underline{v} = \{v_n, v_{n-1}, v_{n-2}, \ldots, v_{n-m}\}^T,$$

$$\underline{Z} = \{z_0, Z_1, Z_2, \ldots, Z_{m-1}\}^T,$$

and W is the circular matrix $$= \begin{bmatrix} w_n & w_{n-1} & w_{n-2} & \ldots & w_{n-m} \\ w_{n-1} & \cdot & \cdot & \ldots & \cdot \\ w_{n-2} & \cdot & \cdot & \ldots & \cdot \\ \cdot & \cdot & \cdot & \ldots & \cdot \\ w_{n-m} & \cdot & \cdot & \ldots & w_{n-2m} \end{bmatrix}$$

This can be written more compactly as $$\underline{e} = \underline{y} + U\underline{C},$$

where U is the matrix W augmented with the vector $\underline{v}$, and $\underline{C}$ is the vector of coefficients, $\underline{Z}$, augmented with the amplifier gain K. That is $$= [\underline{v}: W],$$

and $$\underline{C} = \{K, z_0, z_1, \ldots, z_m\}^T$$

The equation for e is in a standard form for sampled-data filters, and a variety of methods may be used to determine the vector of filter coefficients, $\underline{C}$.

For example, for stationary signals, y, the optimal vector of coefficients can be defined to be that which minimizes the variance (mean square) of the signal at the sensor, i.e. that which minimizes $$J = <\underline{e}^T \underline{e}>$$

The optimal vector of coefficients is $$\underline{C} = -<U^T U>^{-1} <U^T \underline{y}>.$$

Other optimal vectors can be found which minimize J, or other cost functions, subject to various constraints.

We therefore have a means for determining the coefficients of a filter with low throughput delay.

For non-stationary signals, that is those whose statistics vary with time, or for time-varying systems, various adaptive algorithms can be used. One example is to use an adaptive update. At the k-th update step this takes the form, $$\underline{C}^{k+1} = (1 - \mu L)\underline{C}^k - \mu B \underline{e}^k,$$

where μ is the convergence step-size, B is a matrix which is dependent on the controller input signal and the system response (A), and L is a matrix (often a diagonal matrix) which can depend upon both the system response and the controller output signal.

Examples are, $$B = U^T,$$

$$L = \lambda I,$$

which gives an LMS or gradient type algorithm, and $$B = <U^T U + \lambda I>^{-1} U^T,$$

$$L = I - BU.$$

which gives Newton or steepest descent type algorithm. In the above λ is a non-negative number and I is the identity matrix. Many variations are possible.

Figure 9:
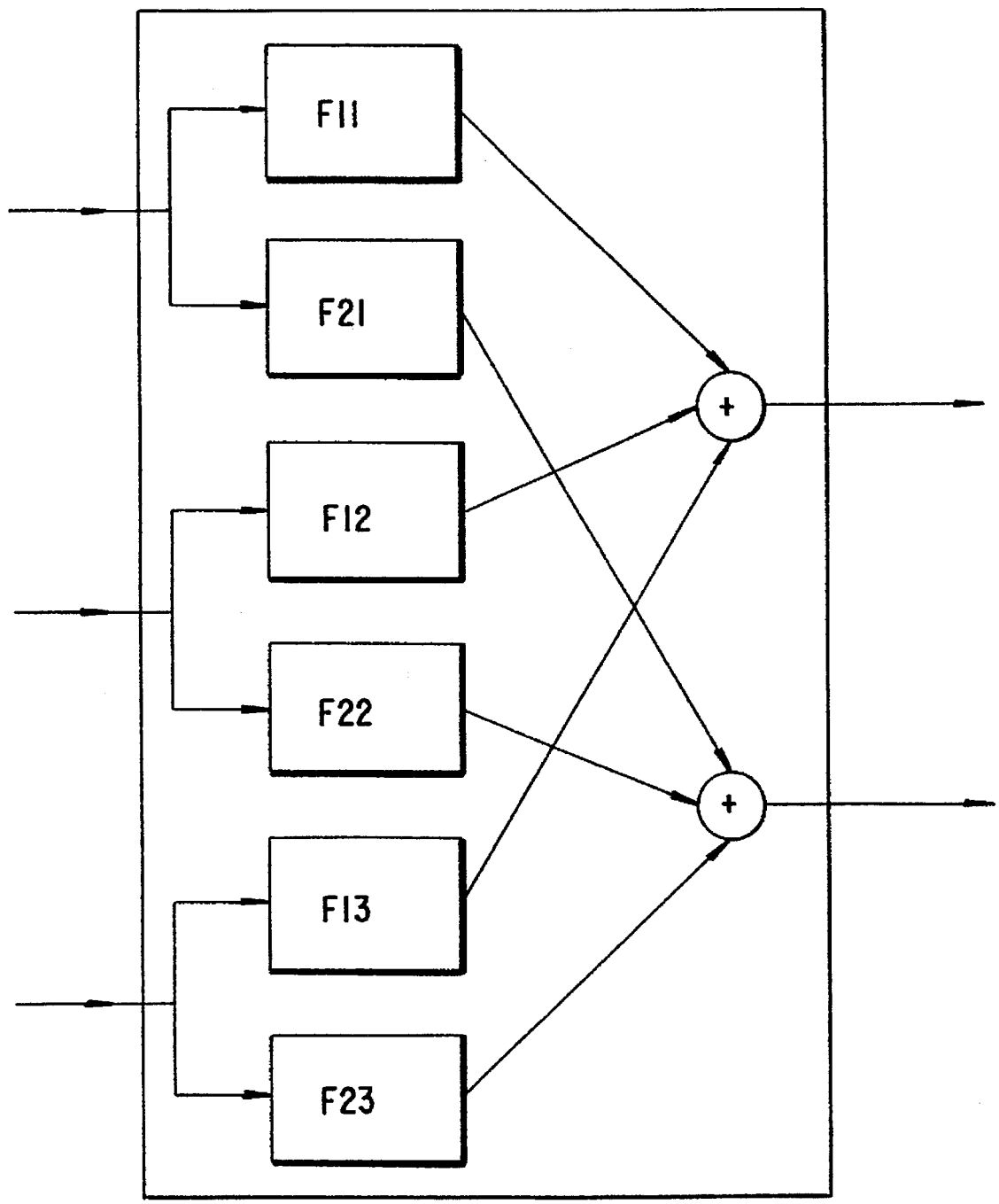

The same approach can be used for multi-channel systems, even when there is significant interaction between the channels. An example of a multi-channel filter with 3 inputs and 2 outputs is shown in FIG. 9. It utilizes 6 single channel filters, whose outputs are combined as shown in the figure.

Note however, that in the above derivation the error signal and the filtered input signal were sampled at the sampling rate of the high rate sampled-data filter. This means that the information for the adaptive update must be collected at this rate. Furthermore, the impulse response, A(t), does not include the anti-imaging filter for the slow sampled-data filter, so it is not easy to measure, and the filtered input signal, v(t), is difficult to calculate since it involves a convolution with high sampling rate data. For applications where the filter characteristic can be determined off-line this may not be a problem, but one of the purposes of the current invention is to minimize the computational requirements. This is achieved by using a design or adaption approach which only uses the data sampled at the slower sampling rate.

One way of modifying the above approach, which constitutes one aspect of this invention, will now be described. This approach seeks to use only slow-rate data to adjust the filter coefficients. This further reduces the computational requirements for the signal processor.

Rather than use the cost function J described above, a different cost function is used. This cost function corresponds to minimizing the filtered error signal $$(F_1 * F_2 * e)(rT) = (F_1 * F_2 * y)(rT) + v_s(rT)K + \sum_n w_s(rT, n) \cdot z_n$$

where $$v_s(rT) = \sum_l A_s(rT - lT) \cdot u_1(lT),$$

$$w_s(rT, n) = \sum_l (F_1 * A_s)(rT - lT) \cdot u_{12}(ll - NnlT)$$

$$= \sum_l (F_1 * F_2 * A_s)(rT - lT) \cdot u_1(ll - NnlT)$$

and $A_s = F_2 * A$. The star denotes the convolution operator.

This error can sub-sampled at the slower sampling rate, without introducing aliasing, to give $$(F_1 * F_2 * e)(rNT) = (F_1 * F_2 * y)(rNT) +$$

$$v_s(rNT)K + \sum_n w_s((r - l)NT) \cdot z_n$$

where $$w_s(rNT) = \sum_l (F_1 * F_2 * A_s)((r - l)NT) \cdot u_1(lNT)$$

This form of the equation is preferred since the impulse response $A_s$ can be measured directly at the slow sampling rate, and the signal $u_1 = F_1 * u$ is available at the slow sampling rate as the input to the slow sampled-data filter.

The new cost function is given by $$J = <\underline{e}^T H^T H \underline{e}>,$$

where H is the circular matrix corresponding to a filter with response $F_1 * F_2$ In matrix notation $$H\underline{c} = H\underline{y} + U_s \underline{c}_s$$

where the matrix of signals $U_s$ is defined analogously to U, except that instead of v(t) and w(t) it uses the filtered signals $v_s(t)$ and $w_s(t)$.

The update equations are defined analogously to those using the higher sampling rate data (with U replaced by $U_s$).

The process of minimizing the filtered error signal rather than the error signal itself allows the filter coefficients to be updated using only data sampled at the slow rate. This results in a significant reduction in the amount of computation required.

One of the requirements of the filter described above is for data at two different sampling rates. This can achieved by using separate analog-to-digital converters for each sampling rate, each preceded by the appropriate analog anti-aliasing filter. Similarly, separate digital-to-analog converters can be used for each filter output. The analog outputs would each pass through the appropriate anti-imaging filter before being summed to produced the combined out An alternative approach is to use a single high rate analog-to-digital converter preceded by the appropriate analog anti-aliasing filter. The slower rate data can then be obtained by digital filtering and decimation (sub-sampling). Similarly, the low rate digital output can be interpolated and filtered to produce a digital signal at the higher rate. This signal can then be digitally combined with the high rate output signal before being passing to a common digital-to-analog converter and anti-aliasing filter.

This type of decimation, interpolation and filtering is currently found in one-bit converters (often known as sigma-delta converters or codecs). Many efficient techniques have been developed. One of the advantages of these converters is that the filtering and conversion for several inputs and outputs can easily be achieved by a single integrated circuit chip. This results in a low-cost device. The initial sampling rates can be very high (often above 1 megahertz) and the data is then decimated in several stages before the final digital output is obtained. These devices can easily be modified to provide several outputs at different rates and so they are ideally suited for use with the filters of this invention.

The adaption process requires knowledge of the system response $A_s$. Since this is only required at the slow sampling rate it can be measured by usual techniques such as an initial calibration (using a test signal) and/or using on-line system identification (as described, for example, by Eriksson, U.S. Pat. No. 4,667,676.

For some control applications the input (reference) signal is not isolated from the actuator. This is always the case for feedback control since the reference signal and the error signal are obtained from the same sensor. This situation results in a feedback loop from the controller output to its input which complicates the adaption process. However, there are well known techniques for dealing with this (see Eriksson, U.S. Pat. No. 4,667,676 for example). One approach is to compensate for the feedback by modeling the feedback path with an additional fixed or adaptive filter and subtracting an estimate of the feedback component from the input signal (see Chaplin, U.S. Pat. No. 4,122,303). It may be necessary to use an additional low delay filter to model this feedback accurately. This filter can be adapted in the same way as the control filter by considering the error between the actual response to a test signal and the predicted response (as in FIG. 6). Similarly, a filtered version of this error signal can be used to reduce the amount of processing required.

Figure 10:
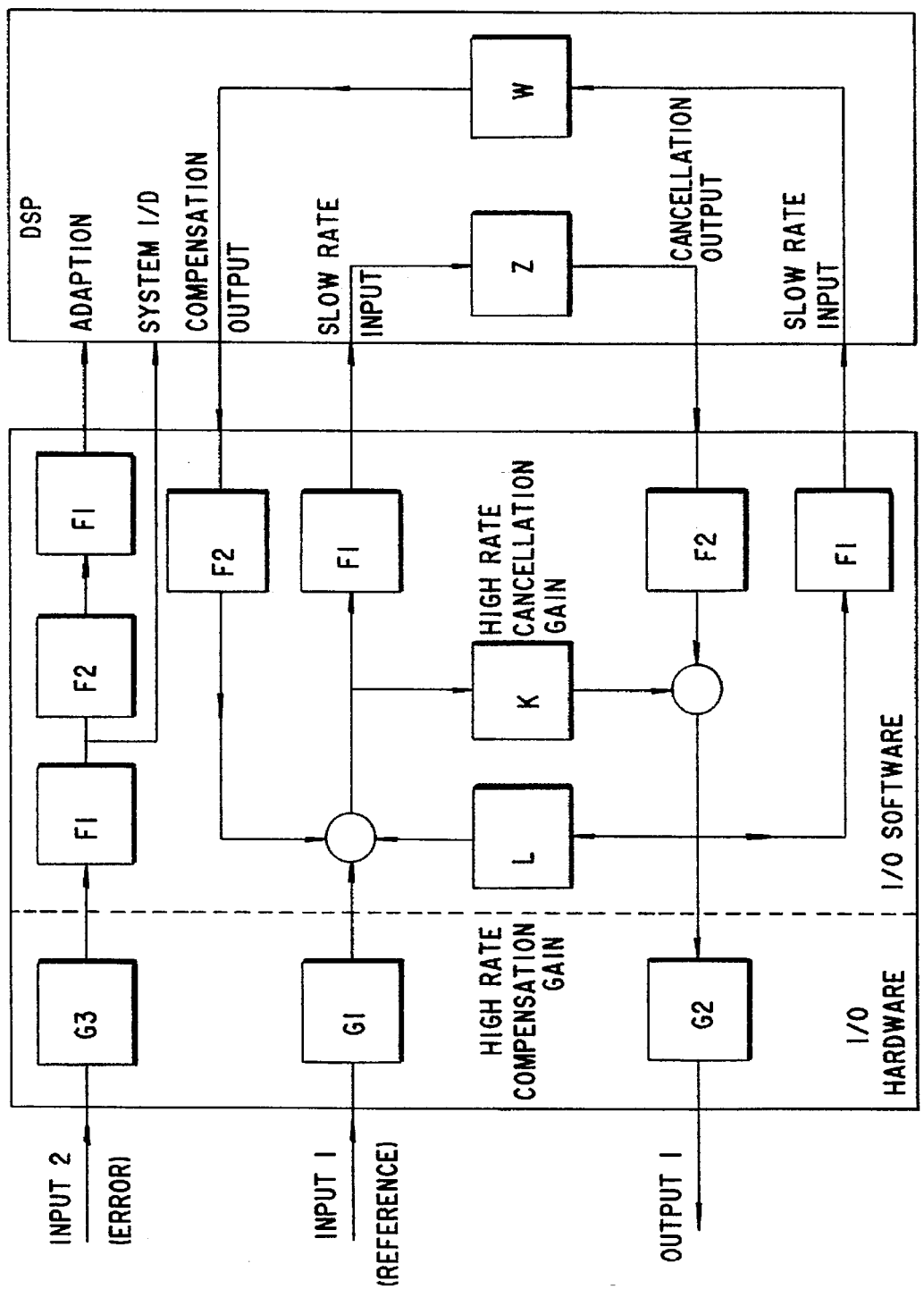

An example of a single channel adaptive feedforward (AFF) controller is shown in FIG. 10. This utilizes a sigma delta converter chip with two inputs and one output, and a general purpose Digital Signal Processing chip (DSP). In another embodiment the DSP is replaced by custom signal processing hardware such as an adaptive filter chip. In FIG. 10 F1 denotes a digital low pass filter and decimator (sub-sampler) and F2 denotes a digital interpolator. G1 denotes the analog anti-aliasing filter, 1-bit analog to digital converter and first stage decimator and G2 denotes the 1-bit digital to analog converter and analog anti-imaging filter. The controller includes compensation for the actuator feedback to the reference sensors (using both a high rate gain, L, and a slower rate digital filter, W). In this embodiment the anti-aliasing and interpolation filtering is all done on the Sigma-Delta chip, as is the filtering of the error signal. This means that the DSP is only using the slow speed digital data.

Figure 11:
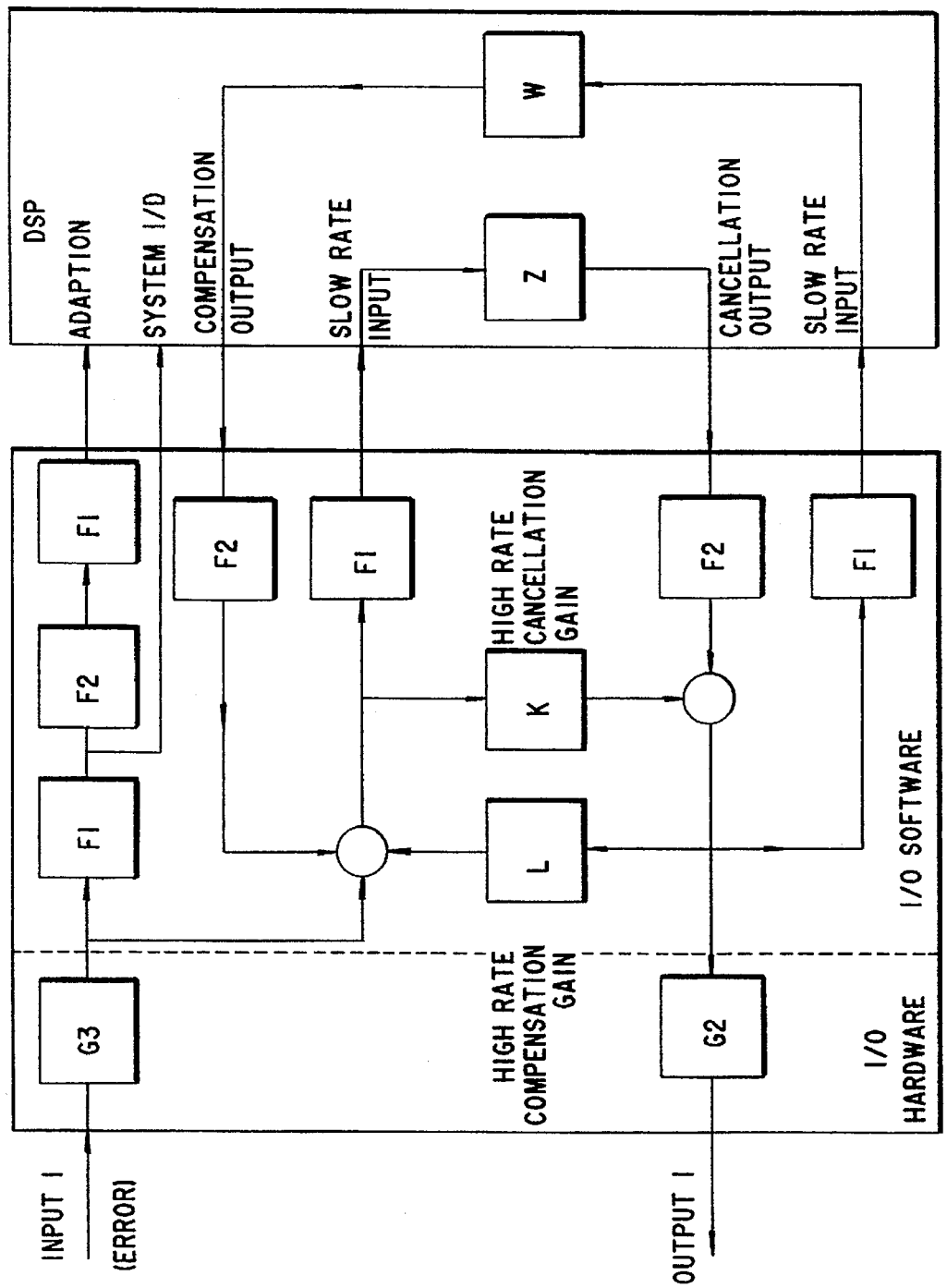

An example of a single channel adaptive feedback (AFB) controller is shown in FIG. 11. This is very similar to the AFF controller but utilizes a sigma delta converter chip with a single input and one output.

Figure 12:
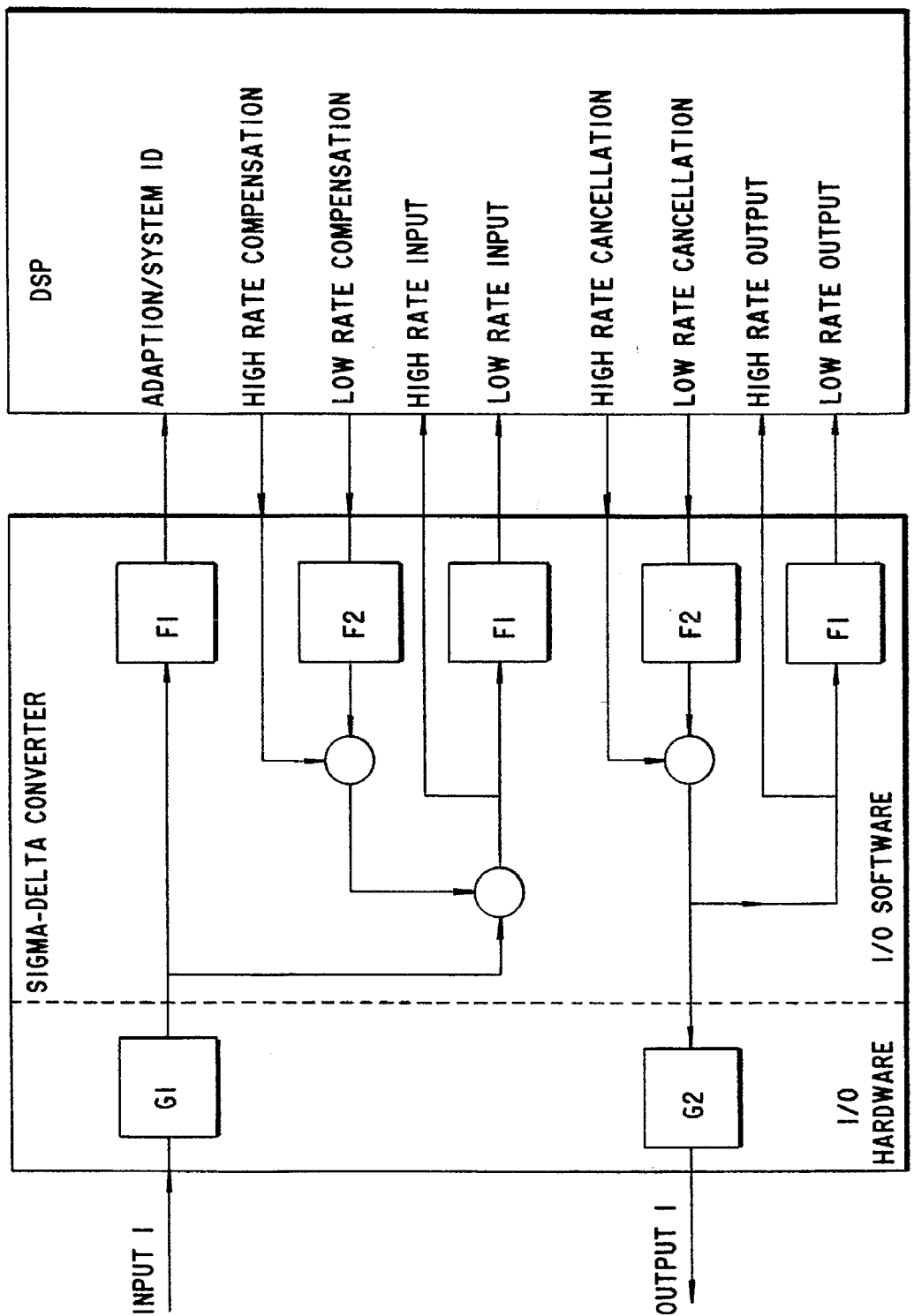

For multi-channel applications it is sometimes necessary to compensate for the feedback between each actuator and sensor. In this case, coupling pairs of inputs and outputs as in FIG. 10 is not sufficient. In this case it may be necessary to do the high rate filtering on the DSP chip. An example of an input/output chip for this application is shown in FIG. 12. Only one input and output are shown, but the structure is just repeated for additional channels.

The input/output hardware and the signal processing hardware and the associated electronics can be combined on a single integrated circuit chip as shown in FIG. 13 for example. This results in a high performance, low cost control system which can be applied to many noise and vibration control problems.

Examples of applications where low cost controllers are required include noise canceling headsets, noise and vibration control for home appliances such as vacuum cleaners and range hoods, electronic mufflers for automobiles, noise filters for communication signals and vibration controllers for active panels and enclosures.

I claim:

1. An adaptive filter with low throughput delay comprising input means for receiving an input signal and providing a first signal at a first sampling rate, said input means including anti-aliasing filter means and sampling means, first sampled-data filter means operating at said first sampling rate and producing a second signal in response to said first signal, output means operating on said second signal and producing a first output signal, said output means including anti-imaging filter means, at least one additional filter means operating on said input signal and producing a second output signal, combining means for combining said first output signal and said second output signal and producing a combined output signal, adaption means responsive to an error signal sampled at said first sampling rate and configured to adjust the characteristics of said first sampled-data filter means and said additional filter means, said error signal being representative of the difference between the overall filter response and a desired filter response, characterized in that at least one of the additional filter means has a low throughput delay compared to the first sampled data filter means.

2. An adaptive filter as in claim 1 wherein said adaption means is also responsive to said first signal.

3. An adaptive filter as in claim 1 wherein said error signal is filtered through models of said anti-aliasing filter means and said anti-imaging filter means before being used to adjust the characteristics of said additional filters.

4. An adaptive filter according to claim 1 wherein the additional filter means comprises one or more second sampled-data filters with second sampling rate and one or more coefficients, further characterized in that said second sampling rate is faster than said first sampling rate and the number of coefficients in said second sampled-data filter is less than the number of coefficients in said first sampled-data filter.

5. An adaptive filter means according to claim 4 wherein said first sampled-data filter and said second sampled-data filters are digital filters.

6. An adaptive filter means according to claim 5 in which said input signal is obtained from a single analog to digital converter.

7. A filter means according to claim 6 wherein said single analog to digital converter is a one-bit (sigma delta) converter.

8. A filter means according to claim 5 wherein said first and second output signals are digital signals which are combined and passed to a single digital to analog converter.

9. A filter means according to claim 8 wherein the single digital to analog converter is a one-bit (sigma delta) converter.

10. An adaptive filter according to claim 1 wherein the additional filter means is an analog filter or gain.

11. An adaptive filter according to claim 10 wherein the analog filter or gain is digitally controlled.

12. An adaptive filter according to claim 1 wherein said adaption means operates to minimize the mean square value of said error signal.

13. An adaptive filter as in claim 1 further characterized in that said input means, said output means, said additional filter means and said combining means are implemented on a single integrated circuit chip.

14. An adaptive filter as in claim 1 in which said first sampled-data filter is a digital filter and further characterized in that said first sampled-data filter and said adaption means are implemented on a single integrated circuit chip.

15. A multichannel adaptive filter with low throughput delay comprising input means for receiving one or more input signals and providing first signals at a first sampling rate, said input means including anti-aliasing filter means and sampling means, first sampled-data filter means operating at said first sampling rate and producing second signals in response to said first signals, output means operating on said second signals and producing first output signals, said output means including anti-imaging filter means, at least one additional filter means operating on said input signals and producing second output signals, one or more combining means for combining said first output signals and said second output signals and producing one or more combined output signals, adaption means responsive to at least one error signal sampled at said first sampling rate and configured to adjust the characteristics of said first sampled-data filter means and said additional filter means, said error signals being representative of the difference between the overall filter response and a desired filter response, characterized in that at least one of the additional filter means has a low throughput delay compared to the first sampled-data filter means.

16. A control system for reducing or modifying an original disturbance, said system including at least one adaptive filter with low throughput delay and said system comprising one or more input sensors providing one or more input signals related at least in part to the original disturbance input means for receiving said input signal and providing first signals at a first sampling rate, said input means including anti-aliasing filter means and sampling means, first sampled-data filter means operating at said first sampling rate and producing second signals in response to said first signal, output means operating on said second signals and producing a first output signals, said output means including anti-imaging filter means, at least one additional filter means operating on said input signals and producing second output signals, combining means for combining said first output signals and said second output signals to produce one or more drive signals, one or more actuators responsive to said drive signals and causing a control disturbance, residual sensors responsive to the combination of an original disturbance and said control disturbance and producing at least one error signal, adaption means responsive to at least one error signal sampled at said first sampling rate and configured to adjust the characteristics of said first sampled-data filter means and said additional filter means, characterized in that at least one of the additional filter means has a low throughput delay compared to the first sampled data filter means.

17. A control system according to claim 16 and including additional filter means to compensate for any feedback between the actuators and the input sensors.

18. A method for configuring a filter with low throughput delay wherein said filter comprises input means for receiving an input signal and providing a first signal at a first sampling rate, said input means including anti-aliasing filter means and sampling means, first sampled-data filter means operating at said first sampling rate and producing a second signal in response to said first signal, output means operating on said second signal and producing a first output signal, said output means including anti-imaging filter means, at least one additional filter means operating on said input signal and producing a second output signal, said additional filter means having a low throughput delay compared to the first sampled data filter means, combining means for combining said first output signal and said second output signal and producing a combined output signal, and said method comprises forming a matrix, U, of filtered input signals, calculating a vector, $\underline{C}$, of filter coefficients according to $$\underline{C} = <U^T U>^{-1} <U^T \underline{y}>$$

where $\underline{y}$ is a vector of desired signals and the angled brackets denote an expected value.

19. A method for configuring a filter with low throughput delay wherein said filter comprises input means for receiving an input signal and providing a first signal at a first sampling rate, said input means including anti-aliasing filter means and sampling means, first sampled-data filter means operating at said first sampling rate and producing a second signal in response to said first signal, output means operating on said second signal and producing a first output signal, said output means including anti-imaging filter means, at least one additional filter means operating on said input signal and producing a second output signal, said additional filter means having a low throughput delay compared to the first sampled data filter means, combining means for combining said first output signal and said second output signal and producing a combined output signal, and said method comprises forming a matrix, $U_s$, of filtered input signals, calculating a vector, $\underline{C}$, of filter coefficients according to $$\underline{C} = <U_s^T U_s>^{-1} <U_s^T H \underline{y}>$$

where $\underline{y}$ is a vector of desired signals and H is a matrix corresponding to the response of said anti-aliasing and said anti-imaging filters and the angled brackets denote an expected value.

* * * * *